United States Patent [19]
Obeng et al.

[11] Patent Number: 6,083,810
[45] Date of Patent: Jul. 4, 2000

[54] INTEGRATED CIRCUIT FABRICATION PROCESS

[75] Inventors: Yaw Samuel Obeng; Susan Clay Vitkavage, both of Orlando, Fla.

[73] Assignee: Lucent Technologies, Murray Hill, N.J.

[21] Appl. No.: 08/761,059

[22] Filed: Dec. 5, 1996

Related U.S. Application Data

[63] Continuation of application No. 08/504,955, Jul. 20, 1995, abandoned, which is a continuation of application No. 08/241,812, May 12, 1994, abandoned, which is a continuation-in-part of application No. 08/152,543, Nov. 15, 1993, abandoned.

[51] Int. Cl.$^7$ ................................................... H01L 21/76
[52] U.S. Cl. ............................................................. 438/448
[58] Field of Search .................................... 438/448, 439, 438/372; 148/DIG. 117

[56] References Cited

U.S. PATENT DOCUMENTS

| | | | |
|---|---|---|---|
| 4,407,696 | 10/1983 | Han et al. | 156/652 |
| 4,460,417 | 7/1984 | Katsumi et al. | 148/187 |
| 4,597,160 | 7/1986 | Ipri | 29/571 |
| 4,642,878 | 2/1987 | Maeda | 29/571 |
| 4,725,561 | 2/1988 | Haond et al. | 438/424 |
| 4,900,396 | 8/1988 | Hayashi et al. | 156/651 |
| 5,028,559 | 7/1991 | Zdebel et al. | 438/404 |
| 5,135,886 | 8/1992 | Manocha et al. | 438/482 |
| 5,175,123 | 12/1992 | Vasquez et al. | 438/448 |
| 5,177,569 | 1/1993 | Koyama et al. | 457/412 |
| 5,312,770 | 5/1994 | Pasch | 438/431 |
| 5,318,922 | 6/1994 | Lim et al. | 438/448 |
| 5,358,893 | 10/1994 | Yang et al. | 438/448 |
| 5,374,585 | 12/1994 | Smith et al. | 438/443 |
| 5,451,540 | 9/1995 | Kawaguchi et al. | 438/448 |
| 5,580,815 | 12/1996 | Hsu et al. | 438/448 |

FOREIGN PATENT DOCUMENTS

| | | |
|---|---|---|
| 58-114442 | 7/1983 | Japan . |
| 59-194423 | of 1984 | Japan . |
| 2-35710 | of 1990 | Japan . |
| 404091425 | 3/1992 | Japan . |

OTHER PUBLICATIONS

"The Impact of Poly–removal Techniques on Thin Thermal Oxide Property in Poly–Buffer LOCOS Technology", J. M. Sung et al., IEEE Trans. on Electron Devices, vol. 38, No. 8, Aug. 1991, pp. 1970–1973.

"Twin–White Ribbon Effect and Pit Formation Mechanism in PBLOCOS", Tin–hwang Lin et al., J. Electrochem. Soc., vol. 138, No. 7, Jul. 1991, 2145–2149.

"Stress Induced Void Formation in Interlevel Polysilicon Films During Polybuffered Local Oxidation of Silicon", J. Nagel et al., J. Electrochem. Soc. vol. 140, No. 8, Aug. 1993, pp. 2356–2359.

"Poly–void Formation in Poly Buffer LOCOS Process", H.S. Yang et al., Extended Abstracts of the Electrochem., Soc. Meeting, Spring 1992, St. Louis, May 17–22. Abstractb #274, pp. 442–443.

"Silicon Processing for the VLSI Era, vol. 1: Process Technology", Stanley Wolf, Ph.D., Professor, Dept. of Electrical Engineering, California State University, Long Beach, California and Instructor, Eng. Extension, University of California, Irvine, pp. 177–194.

*Primary Examiner*—Savitri Mulpuri

[57] ABSTRACT

A method of semiconductor circuit fabrication utilizing the poly buffered LOCOS process is disclosed. Amorphous silicon is desirably formed by the decomposition of disilane at temperatures between 400–525° C. The amorphous silicon exhibits less pits than what is produced by conventional processes. The absence of pits contributes to eventual substrate integrity.

9 Claims, 1 Drawing Sheet

INTEGRATED CIRCUIT FABRICATION PROCESS

CROSS-REFERENCE TO RELATED APPLICATION

This is a continuation of application Ser. No. 08/504,955 filed Jul. 20, 1995, now abandoned, which is a continuation of Ser. No. 08/241,812 filed May 12, 1994, now abandoned, which is a continuation-in-part of application Ser. No. 08/152,543 (Y. S. Obeng 2-2) filed Nov. 15, 1993, now abandoned.

TECHNICAL FIELD

This invention relates, in general, to integrated circuit processing, and more particularly to integrated circuit processing utilizing a poly buffered LOCOS process.

BACKGROUND OF THE INVENTION

Poly buffered local oxidation of silicon isolation technology uses a poly silicon film sandwiched between a thermal silicon oxide and a silicon nitride film to relieve stress during substrate oxidation. The stress relief is important to minimize stress induced defects such as dislocations in the silicon substrate. Poly buffered LOCOS technology also offers a number of other advantages, such as shorter bird's beak length.

The integrity of a poly silicon layer during subsequent high temperature processing, such as field oxidation, is crucial to the successful manufacturing of devices with poly buffered LOCOS isolation technology. Pits are frequently observed in the poly silicon layer after the removal of the silicon nitride film, following field oxide growth.

There appears to be a lack of consensus as to the factors that contribute to the pitting phenomenon. For example, although the pits are observed regardless of the process used to remove the silicon nitride layer, either by wet etch or by dry etch, some researchers have correlated the extent of pitting of the polysilicon layer to the soak time in the wet etchant.

Because the processes which remove the polysilicon may tend to transfer the pits into the underlying substrate, those concerned with the developments of integrated circuit technology have sought methods for reducing the size and number of pits.

SUMMARY OF THE INVENTION

The pitting phenomenon is alleviated by the present invention which includes in an illustrative embodiment:

forming an oxide layer upon a substrate;

forming an amorphous silicon layer upon the oxide layer;

forming a material layer upon the amorphous silicon layer;

wherein the amorphous silicon layer is formed at a temperature between 400–550° C. from a chemical precursor;

patterning the material layer;

oxidizing the substrate to form a field oxide; and removing the material layer, the amorphous silicon layer, and forming a transistor upon the substrate.

Illustratively, the precursor may be disilane or a higher silane.

DETAILED DESCRIPTION

Figure 1:
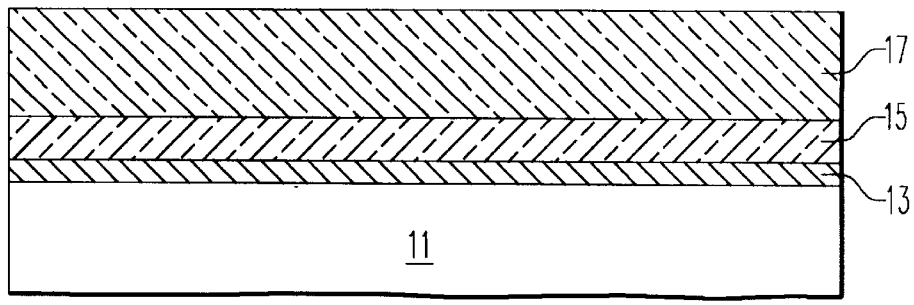
FIGS. 1–4 are cross-sectional views depicting an illustrative embodiment of the present invention.

In FIG. 1 Ref. 11 denotes a substrate which may be silicon, epitaxial silicon, or doped silicon. In general, the term substrate refers to a body upon which a layer or layers may be formed. Ref. 13 denotes a pad oxide, which may, typically have a thickness between 200–400 Å. Ref. 15 denotes a silicon layer which may, typically, have a thickness between 600–1000 Å. Ref. 17 denotes a layer of silicon nitride which may, typically, have a thickness between 2100–2700 Å.

Figure 2:
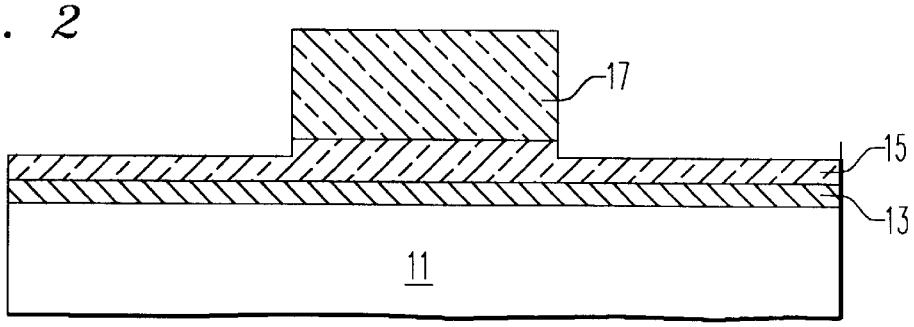

In FIG. 2 silicon nitride layer 17 has been patterned and (optionally) silicon layer 15 has also been partially patterned.

Figure 3:
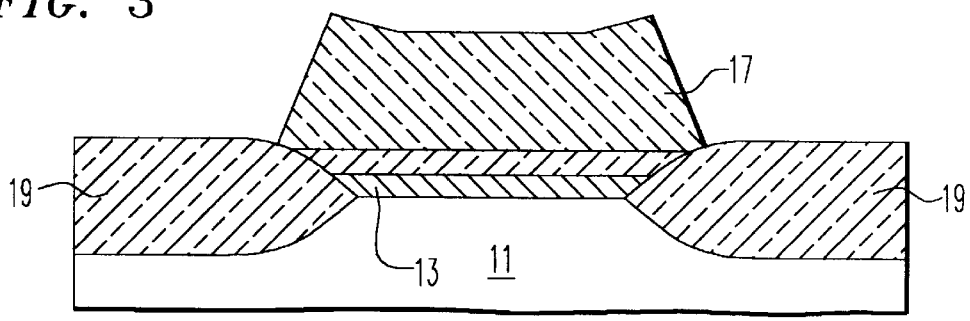
Figure 4:
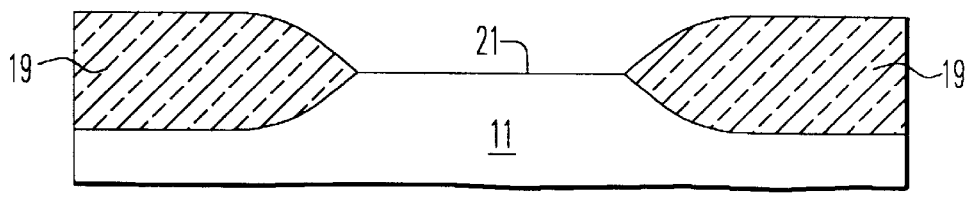

In FIG. 3 field oxide 19 has been formed. In FIG. 4 silicon nitride layer 17, silicon layer 15, and oxide layer 13 have been removed. In the past, pits which have appeared in silicon layer 15 have been transferred by the etching process to surface 21 of silicon substrate 11.

Applicants have found that the number and size of pits appearing in silicon 15 is dramatically reduced when the deposition temperature of silicon layer is maintained as low as possible. For example, formation of silicon layer 15 from disilane ($Si_2H_6$) may be formed at temperatures between 350–550° C. A preferred temperature range is 400–525° C. The as-deposited film is completely amorphous. However, subsequent high temperatures encountered in further processing, including formation of silicon nitride layer 17, tends to cause at least partial polycrystallization of layer 15. In contrast, for example, prior practice utilized silane at a temperature range between 550–600° C. The "as-deposited" films deposited in this temperature range are mixtures of amorphous and polycrystalline silicon.

In addition, trisilane, tetrasilane and other higher silanes (in general, silanes may be represented by the chemical formula: $Si_nH_{2n}$ if n=2, the compound is termed "disilane;" n=3, trisilane, etc.) may be utilized. It is hypothesized that the presence of residual hydrogen in the "as deposited silicon film" tends to inhibit the formation of silicon [111] crystals. Furthermore, at low deposition temperatures, the deposition rate from silane is very low, but manufacturable deposition rates may be obtained from higher silanes.

Deposition may be desirably carried out at a temperature between 400 and 525° C. at a pressure of 300–500 mTorr, in a low pressure chemical vapor deposition reactor.

We claim:

1. A method of semiconductor integrated circuit fabrication, comprising:

forming an oxide layer upon a substrate;

depositing a silicon layer upon the oxide layer;

wherein the silicon layer is formed at a temperature maintained at between 350–550° C. from a chemical precursor selected from the group consisting of disilane and higher order silanes, whereby the formation of silicon crystals is inhibited during deposition so that the as-deposited silicon layer is substantially amorphous;

forming a material layer upon the substantially amorphous as-deposited silicon layer at a temperature such that the substantially amorphous as-deposited silicon layer is at least partially converted to polycrystalline material;

patterning the material layer;

oxidizing the substrate to form a field oxide;

removing the material layer and unoxidized portions of the silicon layer; and forming a transistor upon the substrate.

2. The method of claim 1, wherein the silicon layer is partially patterned after the material layer is patterned.

3. The method of claim 1, wherein the temperature is 400–525° C.

4. The method of claim 1, wherein the silicon layer is formed at a pressure between 300–500 mTorr.

5. A method of semiconductor integrated circuit fabrication, consisting of:

forming an oxide layer upon a substrate;

depositing a silicon layer upon the oxide layer;

wherein the silicon layer is formed at a temperature maintained at between 350–525° C. from a chemical precursor selected from the group consisting of disilane and higher order silanes, whereby the formation of silicon crystals is inhibited during deposition so that the as-deposited silicon layer is substantially amorphous;

forming a material layer upon the substantially amorphous as-deposited silicon layer at a temperature such that the substantially amorphous as-deposited silicon layer is at least partially converted to polycrystalline material;

patterning the material layer;

oxidizing the substrate to form a field oxide;

removing the material layer and unoxidized portions of the silicon layer; and forming a transistor upon the substrate.

6. The method of claim 5, wherein the silicon layer is partially patterned after the material layer is patterned.

7. The method of claim 5, wherein the temperature is 400–525° C.

8. The method of claim 5, wherein the silicon layer is formed at a pressure between 300–500 mTorr.

9. A method of semiconductor integrated circuit fabrication, comprising:

forming an oxide layer upon a substrate;

depositing a silicon layer upon the oxide layer;

wherein the silicon layer is formed at a temperature maintained at between 350–525° C. and at a pressure between 300–500 mTorr from a chemical precursor selected from the group consisting of disilane and higher order silanes, whereby the formation of silicon crystals is inhibited during deposition so that the as-deposited silicon layer is substantially amorphous;

forming a material layer upon the substantially amorphous as-deposited silicon layer at a temperature such that the substantially amorphous as-deposited silicon layer is at least partially converted to polycrystalline material;

patterning the material layer;

oxidizing the substrate to form a field oxide;

removing the material layer and unoxidized portions of the silicon layer; and forming a transistor upon the substrate.

* * * * *